US005191455A

United States Patent [19]

Hashimoto et al.

[11] Patent Number: 5,191,455

[45] Date of Patent: Mar. 2, 1993

[54] DRIVING CIRCUIT FOR A LIQUID CRYSTAL DISPLAY APPARATUS

[75] Inventors: Ryuji Hashimoto, Tenri; Shigeaki Mizushima, Ikoma; Eiichiro Nishimura, Kitakatsuragi; Shigehiro Minezaki, Ikoma; Toshio Takemoto, Nara, all of Japan

[73] Assignee: Sharp Kabushiki Kaisha, Japan

[21] Appl. No.: 629,729

[22] Filed: Dec. 21, 1990

[30] Foreign Application Priority Data

Dec. 27, 1989 [JP] Japan .................................. 1-342118

[51] Int. Cl.[5] .......................... G02F 1/13; H03K 3/01; H03F 3/45

[52] U.S. Cl. ...................................... 359/85; 307/491; 307/296.6; 330/261

[58] Field of Search ................ 350/332; 307/264, 491, 307/296.1, 296.4, 296.6; 328/162, 163; 358/34, 171; 330/261, 259; 359/85

[56] References Cited

U.S. PATENT DOCUMENTS

| | | | |
|---|---|---|---|
| 3,764,922 | 10/1973 | Gilbert et al. | 307/491 |
| 3,936,759 | 2/1976 | Macheel | 307/491 |
| 4,820,023 | 4/1989 | Ohsawa | 359/85 |
| 4,859,871 | 8/1989 | Kobayashi et al. | 307/264 |
| 4,943,736 | 7/1990 | Kihara et al. | 307/491 X |
| 5,027,266 | 6/1991 | Ishii et al. | 359/85 |

FOREIGN PATENT DOCUMENTS

| | | | |
|---|---|---|---|
| 0196889 | 10/1986 | European Pat. Off. . | |
| 0278778 | 8/1988 | European Pat. Off. . | |
| 0285401 | 10/1988 | European Pat. Off. . | |
| 0141026 | 6/1988 | Japan | 350/332 |
| 0183212 | 7/1989 | Japan | 307/264 |

OTHER PUBLICATIONS

Sedra et al., "Microelectrome circuits" (text book), CBS College Publishing, 1982, pp. 74–80.

*Primary Examiner*—William L. Sikes
*Assistant Examiner*—Huy K. Mai
*Attorney, Agent, or Firm*—Nixon & Vanderhye

[57] ABSTRACT

In a driving circuit for a liquid crystal apparatus, a DC offset voltage the level of which changes depending upon the level of input video signals is applied as an input video signal. The DC voltage which appears in the liquid crystal and the level of which changes depending upon the level of input video signals can be completely compensated.

12 Claims, 5 Drawing Sheets

FIG. 1
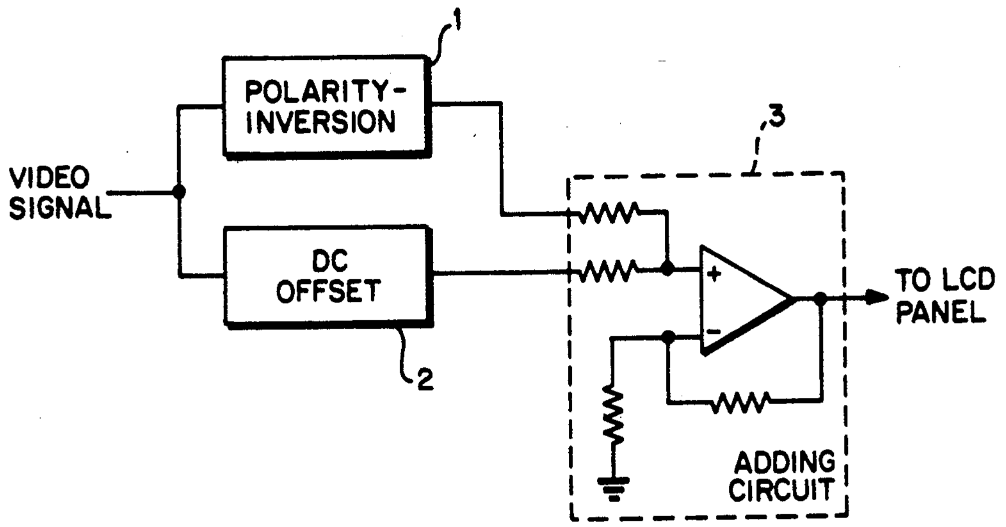
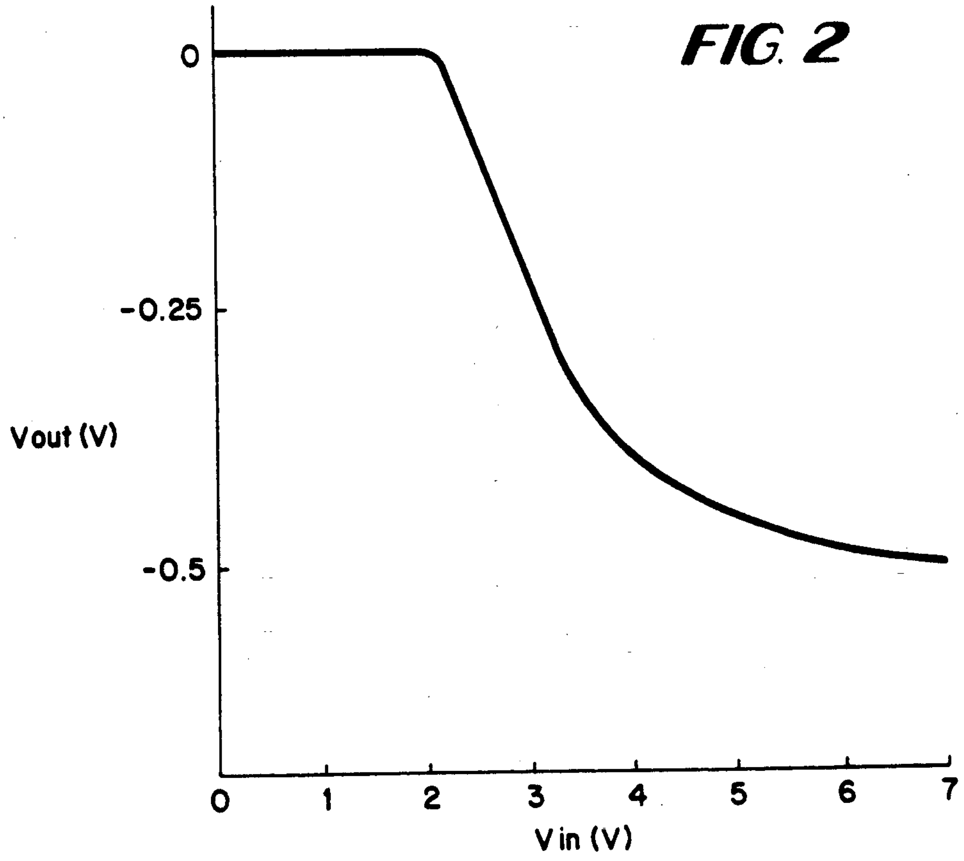
FIG. 2

DRIVING CIRCUIT FOR A LIQUID CRYSTAL DISPLAY APPARATUS

BACKGROUND OF THE INVENTION

1. Field of the Invention

This invention relates to a driving circuit for a liquid crystal display (LCD) apparatus, and more particularly to a driving circuit for an LCD apparatus having an active matrix type LCD panel.

2. Description of the Prior Art

Attention is directed to the related co-pending prior U.S. patent application Ser. No. 07/631,699 filed Dec. 19, 1990 to Nakagawa et al. entitled "A Driving Circuit For A Liquid Crystal Display Apparatus."

Generally, a conventional driving circuit for an LCD apparatus produces AC video signals from input DC video signals, and supplies the AC video signals to source lines of an LCD panel of the LCD apparatus. More specifically, as shown in FIG. 5, input video signal is supplied to a polarity-inverting circuit 41 through a buffer 42. The polarity-inverting circuit 41 alternatingly inverts the polarity of input video signals for each field. Namely, the polarity of video signals output from the polarity-inverting circuit 41 and supplied to an LCD panel is positive for odd fields, and negative for even fields, or vice versa.

FIGS. 6 and 7 show the input-output characteristics of the buffer 42 and polarity-inverting circuit 41, respectively. As shown in FIG. 7, the input-output characteristics of the polarity-inverting circuit 41 is offset toward the positive side by a constant DC offset voltage $V_{offset}$. This DC offset voltage is produced so that the level of the DC component of video signals supplied to the LCD panel can be reduced as low as possible.

The reason why the DC component is to be compensated or canceled by the constant DC offset voltage will be described. FIG. 8 shows an equivalent circuit diagram of a picture element (pixel) of an active matrix type LCD panel in which thin film transistors (TFTs) are used as switching elements. A TFT 71 is disposed at each of crossings of a source line 72 and a gate line 73. The source and gate of the TFT 71 are connected to the source line 72 and gate line 73, respectively. The drain of the TFT 71 is connected to a pixel electrode 74 which opposes a counter electrode 75. Between the pixel electrode 74 and the counter electrode 75, a supplemental capacitance $C_S$ is formed in addition to a capacitance $C_{LC}$ caused by the liquid crystal layer disposed between the pixel electrode 74 and the counter electrode 75. Between the gate line 73 and the pixel electrode 74, furthermore, there is a capacitance $C_{gd}$. When the pixel is to be driven, a scanning pulse $\Delta V_G$ is applied to the gate line 73. To the pixel electrode 74, therefore, applied is the following DC voltage $\Delta V_{DC}$:

$$\Delta V_{DC} = \frac{C_{gd}}{C_{gd} + C_s + C_{LC}} \cdot \Delta V_G \qquad (1)$$

This means that the voltage of the pixel electrode 74 is biased by $\Delta V_{DC}$ with the application of the scanning pulse $\Delta V_G$ to the gate line 73. Therefore, a constant DC offset voltage is added in signals which are applied to the source line 72 or the counter electrode 75, thereby compensating the DC voltage $\Delta V_{DC}$.

Owing to the anisotropy in the dielectric constant of the liquid crystal, however, the capacitance $C_{LC}$ of the liquid crystal layer changes as shown in FIG. 9 with the change of the voltage $V_{LC}$ applied to the liquid crystal layer, resulting in that the DC voltage $\Delta V_{DC}$ varies as shown in FIG. 10. Therefore, the application of a constant DC offset voltage cannot completely compensate the DC voltage $\Delta V_{DC}$ for each pixel. This incomplete compensation of the DC voltage $\Delta V_{DC}$ causes the problems such as the residual image phenomenon which impairs the image quality, the increased deterioration of the LCD panel which reduces the reliability, etc.

SUMMARY OF THE INVENTION

The driving circuit for a liquid crystal display apparatus of this invention, which overcomes the above-discussed and numerous other disadvantages and deficiencies of the prior art, comprises: offset means for generating an offset voltage, the level of said offset voltage corresponding the level of an input video signal; and adding means for adding said offset voltage to an output video signal output toward said liquid crystal display apparatus.

In a preferred embodiment, said driving circuit further comprises a polarity-inverting circuit, and said output video signal is output from said polarity-inverting circuit.

In a preferred embodiment, said offset means comprises: voltage detection means for detecting the level of the input video signal; voltage source for supplying different-level voltages; and selection means for selecting one of said different-level voltages as said offset voltage, in accordance with said detected level of the input video signal.

Thus, the invention described herein makes possible the objectives of:

(1) providing a driving circuit which can drive an LCD apparatus with high image quality;

(2) providing a driving circuit which can drive an LCD apparatus without causing the residual image phenomenon; and (3) providing a driving circuit which can drive an LCD apparatus without lowering the reliability the LCD apparatus.

BRIEF DESCRIPTION OF THE DRAWINGS

This invention may be better understood and its numerous objects and advantages will become apparent to those skilled in the art by reference to the accompanying drawings as follows:

FIG. 1 is a block diagram illustrating a driving circuit according to the invention.

FIG. 2 is a graph showing the input-output characteristics of a DC offset circuit used in the driving circuit of FIG. 1.

DESCRIPTION OF THE PREFERRED EMBODIMENTS

FIG. 1 illustrates a driving circuit according to the invention. The driving circuit of this embodiment is used for driving an LCD apparatus which has a plurality of pixels having the equivalent circuit of FIG. 8. This driving circuit comprises a polarity-inverting circuit 1, a DC offset generating circuit 2, and an adding circuit 3. The polarity-inverting circuit 1 and DC offset generating circuit 2 are connected so that image signals are supplied to the inputs of the two circuits 1 and 2, and that the outputs of both the two circuits are coupled to the adding circuit 3.

The polarity-inverting circuit 1 may have the same construction as that used in a prior art driving circuit, and alternatingly inverts the polarity of input video signals for each field.

Figure 7:
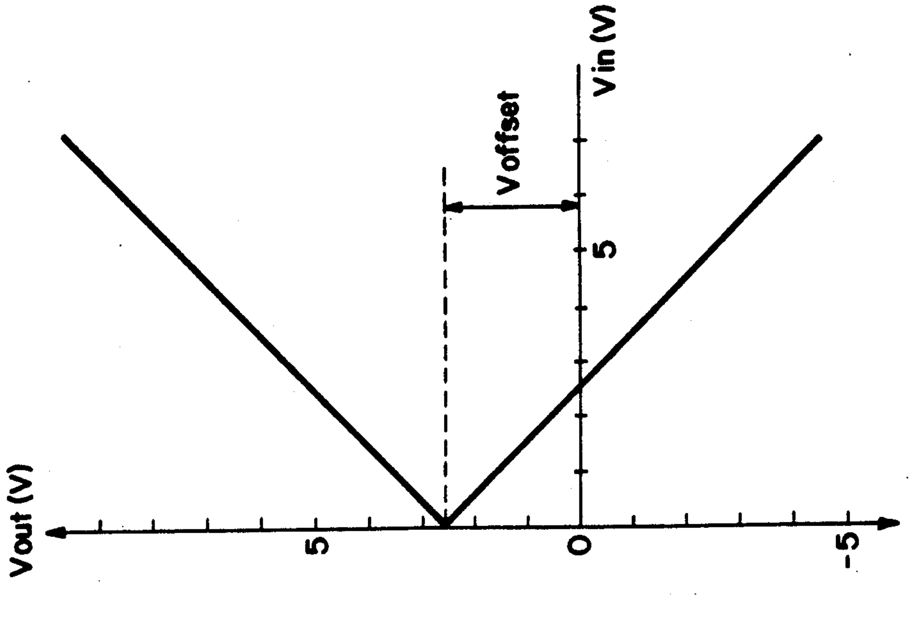
FIG. 7 PRIOR ART
FIG. 7 is a graph showing the input-output characteristics of a polarity-inverting circuit used in the conventional driving circuit of FIG. 5.
Figure 8:
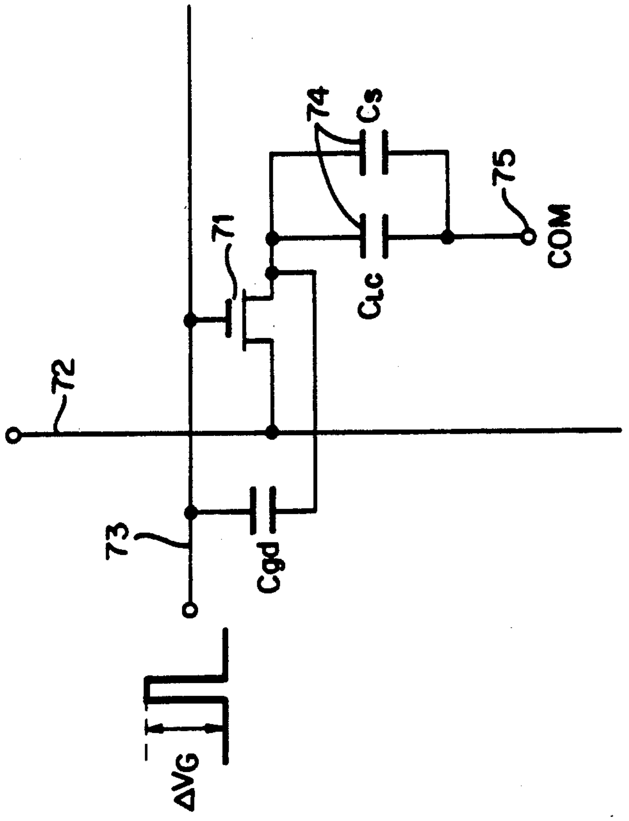
FIG. 8 is an equivalent circuit diagram of a pixel in a TFT active matrix type LCD apparatus.
Figure 9:
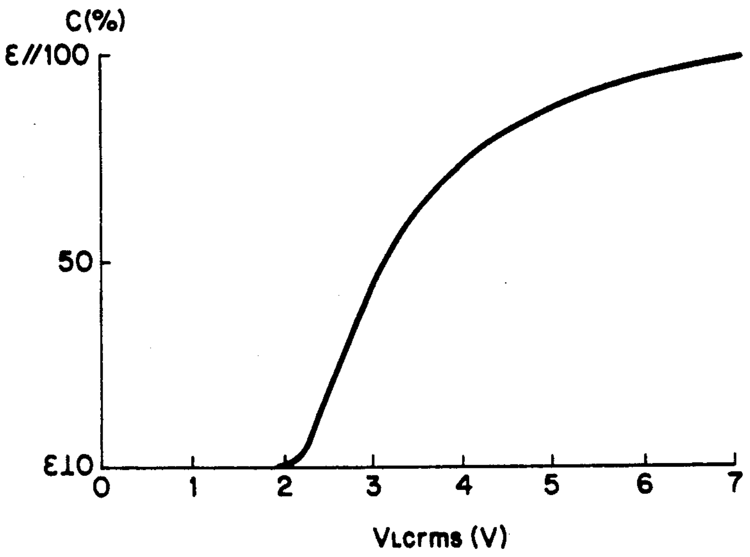
FIG. 9 is a graph showing the change of the capacitance of a liquid crystal with respect to the level change in a voltage applied thereto.
Figure 10:
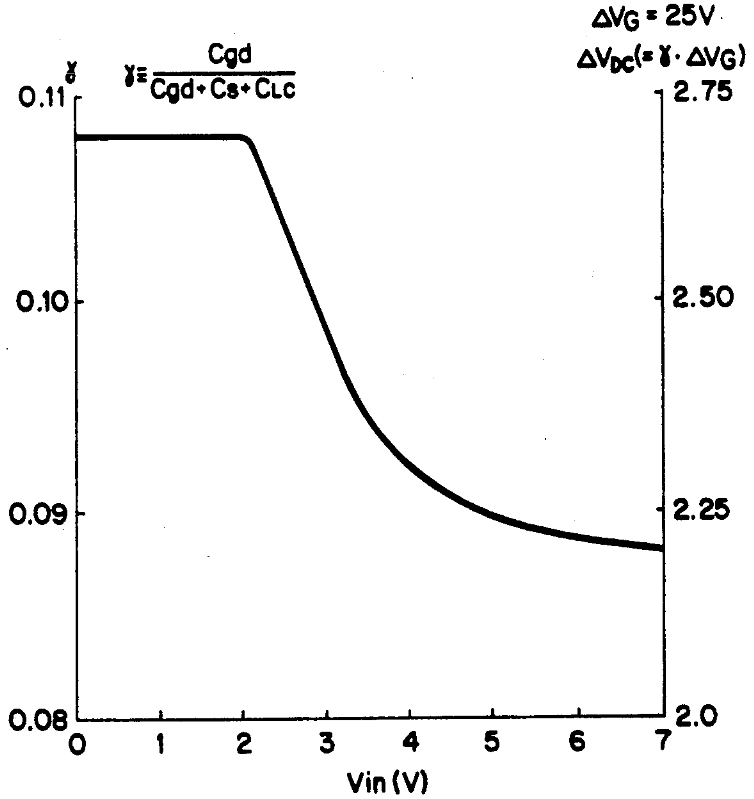
FIG. 10 is a graph showing the change of DC voltage $\Delta V_{DC}$ with respect to the change in the voltage applied to a pixel.

The DC offset generating circuit 2 has the input-output characteristics shown in FIG. 2. As seen from FIG. 2, the input-output characteristics of the DC offset generating circuit 2 correspond to the DC voltage $\Delta V_{DC}$ shown in FIG. 10. Namely, to comply with the decrease of the DC voltage $\Delta V_{DC}$ with the increase of the voltage applied to a pixel, the DC offset voltage output from the DC offset generating circuit 2 is lowered, with the increase the level of the input video signal $V_{in}$. Thus, the circuit 2 generates a DC offset voltage as a function of a characteristic (i.e., DC voltage level) of an input video signal. In this embodiment, a DC voltage for compensating the DC voltage $\Delta V_{DC}$ which is produced when the voltage applied to the pixel is 0 V is applied to the counter electrode 75 (FIGS. 7 and 8).

Figure 3:
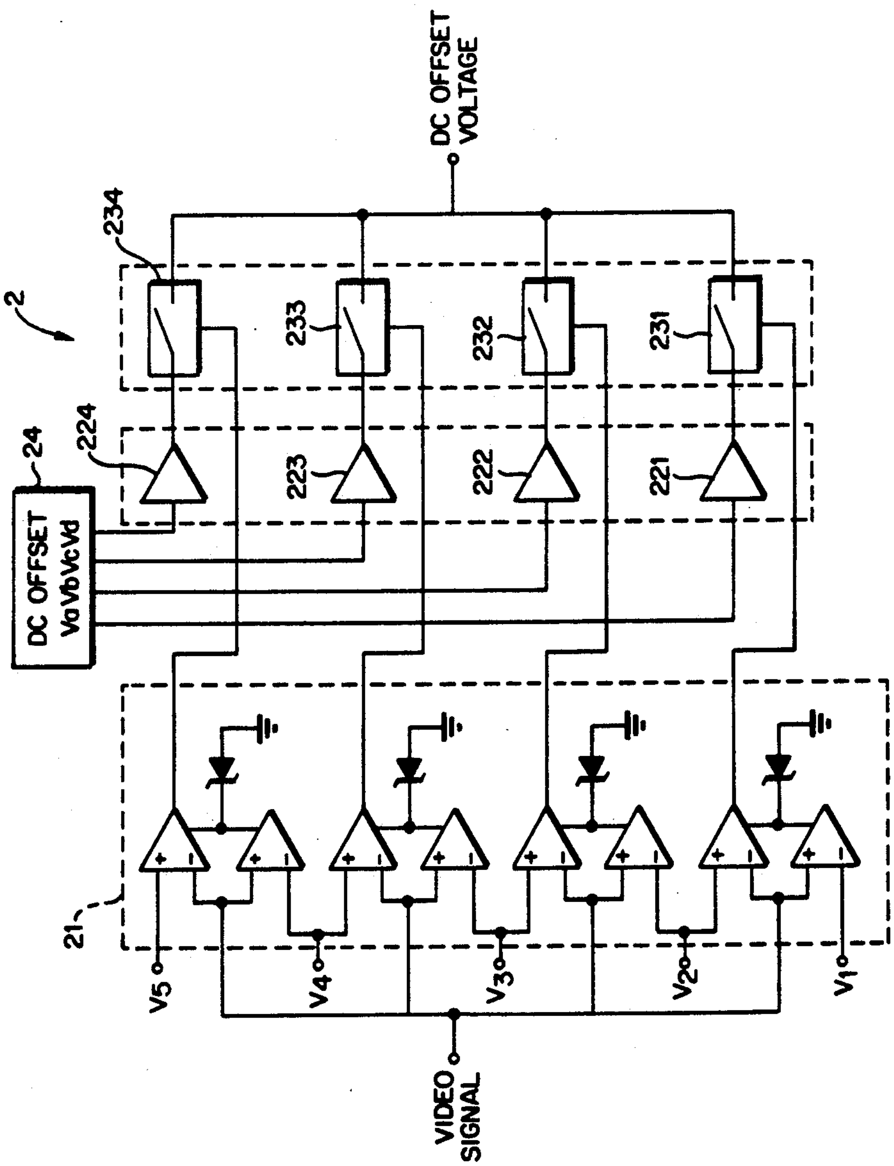
FIG. 3 is a circuit diagram of the DC offset circuit used in the driving circuit of FIG. 1.
Figure 5:
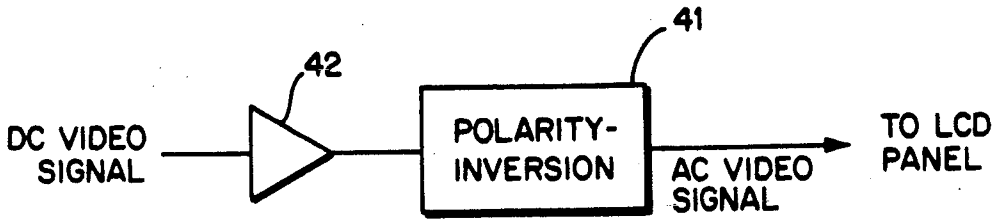
FIG. 5 PRIOR ART
FIG. 5 is a block diagram illustrating a conventional driving circuit.
Figure 6:
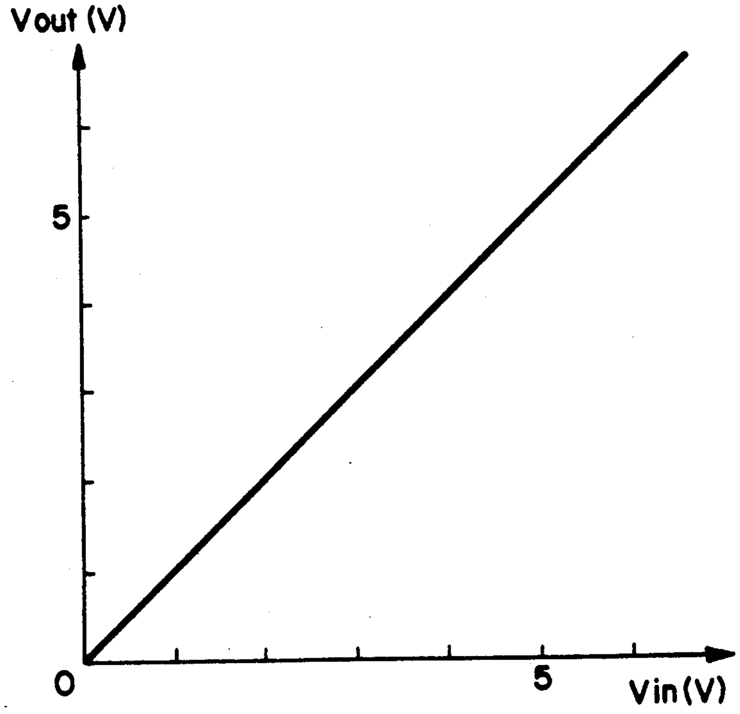
FIG. 6 PRIOR ART
FIG. 6 is a graph showing the input-output characteristics of a buffer used in the conventional driving circuit of FIG. 5.

The electrical configuration of the DC offset generating circuit 2 is shown in FIG. 3. The DC offset generating circuit 2 comprises a comparator 21, a DC voltage generator 24, four buffers 221–224, and four analog switches 231–234. The comparator 21 receives image signals, and compares them with five reference voltages $V_1$–$V_5$ ($V_1<V_2<V_3<V_4<V_5$). Four outputs of the comparator 21 are supplied to the control terminal of the analog switches 231–234, respectively. The DC voltage generator 24 generates four DC voltages $V_a$–$V_d$ ($V_a<V_b<V_c<V_d$) which are respectively supplied to the analog switches 231–234 through the buffers 221–224. When the level of the input video signal is in the range of $V_1$–$V_2$, the analog switch 231 is closed, whereby the DC voltage $V_a$ is output through the buffer 221. In this way, according to the ranges of $V_1$–$V_2$, $V_2$–$V_3$, $V_3$–$V_4$ and $V_4$–$V_5$, which the level of an input video signal belongs to, one of the analog switches 231–234 is closed so that one of the DC voltages $V_a$–$V_d$ is selectively outputted as the DC offset voltage. The pitch and number of the reference voltages which are to be compared with input video signals can be arbitrarily selected. Therefore, the DC offset generating circuit 2 may be modified to have any arbitrarily selected input-output characteristics.

Figure 4:
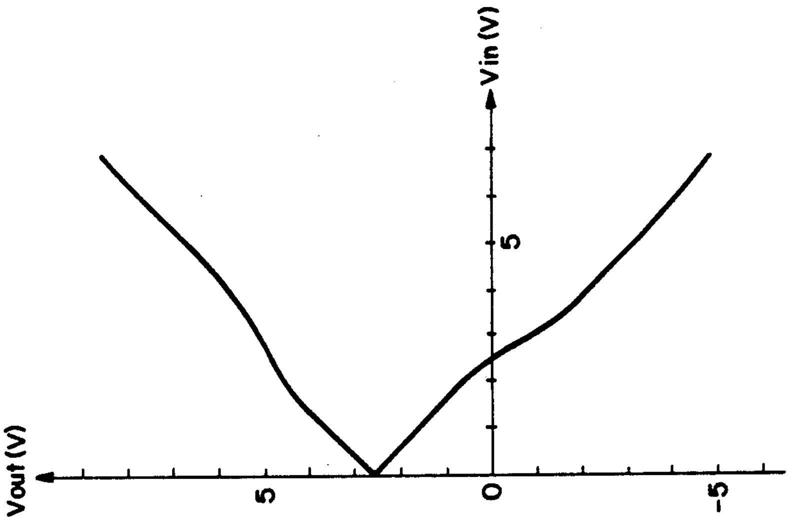
FIG. 4 is a graph showing the input-output characteristics of the driving circuit of FIG. 1.

The DC offset voltage output from the DC offset generating circuit 2 is supplied to one of the input terminals of the adding circuit 3. As described above, the other input terminal of the adding circuit 3 is coupled to the output of the polarity-inverting circuit 1. In the adding circuit 3, the DC offset voltage is added to the video signal output from the polarity-inverting circuit 1. It should be noted that the level of the DC offset voltage is adjusted in accordance with the video signal to which this DC offset voltage is to be added. According to this embodiment, therefore, the DC voltage $\Delta V_{DC}$ can be completely compensated for each pixel. The input-output characteristics of the driving circuit of FIG. 1 is shown in FIG. 4.

Between the output of the adding circuit 3 and the LCD panel, a level shifter or the like may be connected as required.

Residual image periods were measured for both the cases in one of which an LCD apparatus was driven by the drive circuit of this embodiment and in the other of which an LCD apparatus was driven by a conventional driving circuit, with the result that the residual image period in the former case was shortened as short as one hundredth of that in the latter case.

According to the invention, it is possible to substantially completely compensate the DC voltage which changes in level according to the change of the capacitance of the liquid crystal to which the DC voltage is applied. Consequently, the residual image phenomenon is effectively improved, whereby the deterioration of an LCD apparatus caused by the DC voltage can be prevented from occurring to increase the reliability of the LCD apparatus. Furthermore, according to the invention, the contrast of an LCD apparatus can be improved.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A driving circuit for a liquid crystal display apparatus including at least one pixel having a capacitance, comprising:
   - offset means for generating a DC offset voltage as a function of the capacitance of said at least one pixel; and
   - adding means for adding said DC offset voltage to an input video signal to generate an output video signal toward said liquid crystal display apparatus.

2. A driving circuit according to claim 1, wherein said driving circuit further comprises a polarity-inverting circuit, said input video signal is input to said polarity-inverting circuit, and said adding means adds said DC offset voltage to an output signal from said polarity-inverting circuit to generate said output video signal.

3. A driving circuit according to claim 1, wherein said output video signal generated by said adding means is applied to said at least one pixel of said liquid crystal display apparatus through a thin film transistor.

4. A driving circuit according to claim 1, wherein the offset means generates a DC offset voltage as a function of the input video signal, the function having an input-output characteristic based on a variation in capacitance of said at least one pixel during the operation of the driving circuit.

5. A driving circuit for a liquid crystal display apparatus comprising:

offset means for generating a DC offset voltage as a function of a characteristic of an input video signal;

adding means for adding said DC offset voltage to said input video signal to generate an output video signal toward said liquid crystal display apparatus, said offset means further comprising:

voltage detection means for detecting the signal voltage levels of the input video signal;

a voltage generator for supplying a plurality of DC voltages having different DC voltage levels; and selection means for selecting one of said DC voltages as said offset voltage as said function of the input video signal.

6. A driving circuit according to claim 5, wherein said output video signal generated by said adding means is applied to said at least one pixel of said liquid crystal display apparatus through a thin film transistor.

7. A driving circuit for a liquid crystal display apparatus including at least one pixel having a capacitance, comprising:

offset means for generating a DC offset voltage as a function of the capacitance of said at least one pixel during the operation of the driving circuit; and adding means for adding said DC offset voltage to said input video signal to generate an output video signal to said liquid crystal display apparatus, said adding means including an operational amplifier, said operational amplifier having two input terminals, and both of said DC offset voltage and said input video signal being input to one of said two input terminals of said operational amplifier.

8. A driving circuit according to claim 7, wherein the offset means generates a DC offset voltage as a function of the input video signal, the function having an input-output characteristic based on a variation in capacitance of said at least one pixel in operating said driving circuit.

9. A driving circuit for a liquid crystal display apparatus including at least one pixel having a capacitance, comprising:

offset means for generating a DC offset voltage as a function of the capacitance of said at least one pixel during the operation of the driving circuit; and adding means for adding said DC offset voltage to said input video signal to generate an output video signal to said liquid crystal display apparatus; and said offset means further comprising:

voltage detection means for detecting the signal voltage levels of the input video signal;

a voltage generator for supplying a plurality of DC voltages having different DC voltage levels; and selection means for selecting one of said DC voltages as said offset voltage as said function of the input video signal.

10. A driving circuit according to claim 9, wherein the offset means generates a DC offset voltage as a function of the input video signal, the function having an input-output characteristic based on a variation in capacitance of said at least one pixel in operating said driving circuit.

11. A driving circuit for a liquid crystal display apparatus including at least one pixel having a capacitance, comprising:

offset means for generating a DC offset voltage as a function of the capacitance of said at least one pixel during the operation of the driving circuit; and adding means for adding said DC offset voltage to said input video signal to generate an output video signal to said liquid crystal display apparatus, said adding means including an operational amplifier, said operational amplifier having two input terminals, and both of said DC offset voltage and said input video signal through a polarity-inverting circuit being input to one of said two input terminals of said operational amplifier.

12. A driving circuit according to claim 11, wherein the offset means generates a DC offset voltage as a function of the input video signal, the function having an input-output characteristic based on a variation in capacitance of said at least one pixel in operating said driving circuit.

* * * * *